United States Patent [19]

Todd

[11] Patent Number: 4,524,304
[45] Date of Patent: Jun. 18, 1985

[54] SMOKE ALARM ACTIVATED LIGHT

[75] Inventor: Carl D. Todd, Costa Mesa, Calif.

[73] Assignee: Gateway Scientific, Inc., Costa Mesa, Calif.

[21] Appl. No.: 409,584

[22] Filed: Aug. 19, 1982

[51] Int. Cl.³ ............................................. H05B 37/02
[52] U.S. Cl. ..................................... 315/156; 307/351; 315/159; 315/200 R; 340/628; 367/135
[58] Field of Search ........................ 307/351; 340/628; 315/156, 159, 200 R; 367/135

[56] References Cited

U.S. PATENT DOCUMENTS

| 3,166,678 | 1/1965 | Fleshman et al. | 307/351 |
| 4,253,164 | 2/1981 | Hall | 367/135 |
| 4,258,291 | 3/1981 | Scott et al. | 315/156 |

OTHER PUBLICATIONS

Pulse, Digital & Switching Waveforms by Millman and Taub, pp. 706, 707, 712, 713, Aug. 1967.

Primary Examiner—Harold Dixon
Attorney, Agent, or Firm—Spensley, Horn, Jubas & Lubitz

[57] ABSTRACT

A portable light for emergency illumination which is activated in response to the sound emitted by a smoke alarm device. The circuit is highly simplified, making it producible in quantity, and has a performance which is highly predictable. The circuit has a very low battery drain so that it will operate from a small battery for a period of years. The circuit is highly insensitive to extraneous noise signals and utilizes the normal drop in battery voltage when the light comes on to prevent the circuit from going into an oscillation mode.

2 Claims, 1 Drawing Figure

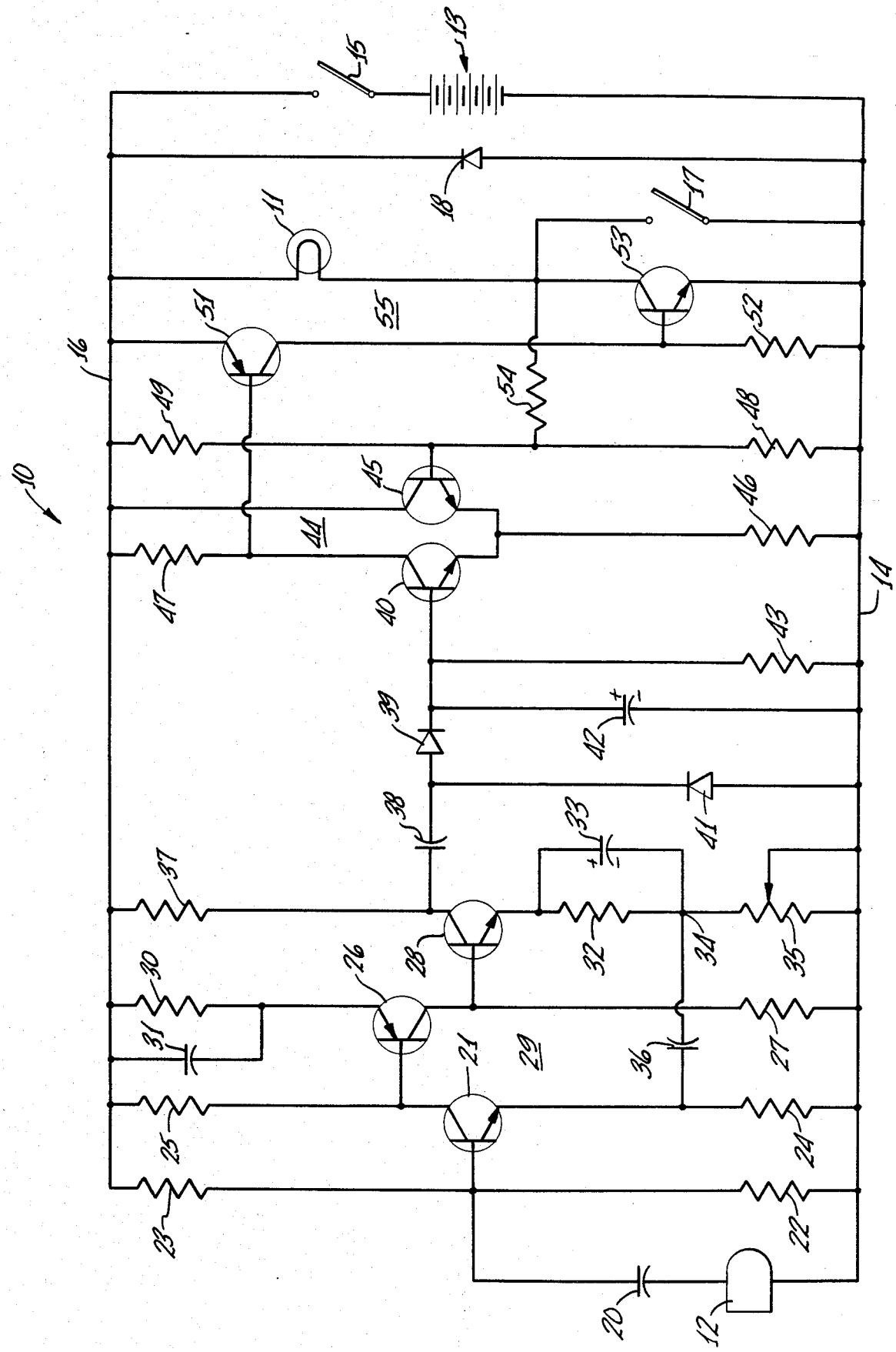

SMOKE ALARM ACTIVATED LIGHT

BACKGROUND OF THE INVENTION

1. Field of the Invention

The present invention relates to a smoke alarm activated light and, more particularly, to a portable light mountable on a wall which is illuminated in response to the audible signal of a smoke alarm device.

2. Description of the Prior Art

Smoke alarm devices have come into widespread use in both residential and commercial establishments in order to alert the occupants to take emergency action in the earliest stages in the development of a fire. By signalling a loud, audible alarm upon the detection of a fire, a structure can be evacuated in an orderly manner. In the daytime, there is generally no problem in doing so because there is adequate light for one to see their way. However, if the occupants of a building are aroused from sleep by an alarm from a smoke detector, there is likely to be confusion and the possibility of an inability to see in attempting to escape from the building. Further, injuries from obstacles unseen in the darkness are a possibility as the occupants move about in attempting to find light switches to evacuate the structure.

In response to this additional need, portable lamps have been developed which are illuminated in response to the sound of a smoke alarm whereby evacuation from a burning building at night is made more safe. Such devices provide a portable light for emergency illumination which is activated in response to the sound emitted by a smoke alarm device. Such a smoke alarm activated portable light is disclosed and claimed in U.S. Pat. No. 4,258,291 issued Mar. 24, 1981, to Robert J. Scott et al.

It is much preferred that such a light be battery operated. This substantially simplifies the light, eliminates the need for various approvals, and permits it to be mounted in any convenient location. On the other hand, making the light battery operated creates the significant problem of designing a system that will provide a significant period of battery life. With current technology and the circuitry generally thought necessary for interconnecting a microphone responsive to the smoke alarm sound signal, the light, and the battery, the current drain would run the battery down within a matter of weeks if the circuit was permitted to operate at all times.

As a result, the smoke alarm activated portable lamp of the Scott et al patent includes light activated circuitry, including a photocell, for rendering the lamp unresponsive to a sound signal during illumination of the light activated circuitry to thereby conserve battery power. The photocell drives an amplifier which is operative to saturate or overdrive the first gain stage of the light activating circuitry to override any signal from the microphone whereby the lamp is rendered unresponsive to the smoke alarm signal upon illumination of the photocell by daylight or artificial light.

The obvious theory of the Scott et al patent is that when there is adequate light to permit the occupants of the building to safely exit therefrom, the portable light may be rendered unresponsive to a smoke alarm sound signal to conserve battery power. However, this has proven to be an unsatisfactory solution to the problem for a variety of reasons. First of all, there are occasions when a room does not receive daylight or artificial illumination for a significant period of time during each day so that the battery wears out very quickly. There are also instances when on a dark day or depending on where the device is located, there is a low enough light level that the circuit will turn on and draw power in a situation that would be unnecessary. Therefore, there are many instances when the circuit is unnecessarily draining the battery. Furthermore, even under normal operating circumstances, the circuit is on all night long so that the battery life has proven to be quite short.

Another problem with using a photocell activated battery saving circuit is in calibration of the photocell. Based upon the wide variety of light levels within a home, the sensitivity of the photocell becomes a significant factor, decreasing the chances of a reliable system.

In the application of John S. Skarman et al, Ser. No. 424,584, filed Sept. 27, 1982 and entitled Smoke Alarm Activated Light, which application is assigned to Gateway Scientific, Inc., the assignee of the present application, there is disclosed a portable light for emergency illumination which includes a switch interconnecting a battery and a light bulb for selectively activating the light bulb and a circuit interconnecting a microphone and the switch for selectively activating the switch in response to a smoke alarm sound signal. According to such application, the circuit which interconnects the microphone and the switch need not be on all of the time. It is satisfactory if the circuit is periodically turned on, for a short period of time, to determine whether the microphone is receiving a smoke alarm sound signal. By removing all power from the main circuit except for a very small fraction of the time, power consumption is significantly reduced. Accordingly, the light includes a strobe circuit interconnecting the source of power and the circuit means for periodically activating the circuit means so that the circuit means is operative and drawing power only for a small percentage of the time.

Significant practical difficulties have been encountered in the use of a smoke alarm activated light incorporating a strobe circuit. The circuit is found to operate differently with microphones of different sensitivities and the on and off times of the circuit vary considerably based upon component tolerances. As a result, a wide variation in circuit operation is found, making the circuit difficult to produce in quantity and resulting in a circuit whose performance is highly unpredictable. As a result, the predicted battery life is difficult to obtain. Furthermore, because of significant variations in the off time, the circuit has varying responses to alarm sounds. Because turn-on of the circuit and activation of the light bulb causes a considerable battery drain and the battery voltage is used to establish a reference level, it is possible for the circuit to go into an oscillation mode when triggered.

SUMMARY OF THE INVENTION

According to the present invention, these problems are solved by providing a portable light for emergency illumination which is activated in response to the sound emitted by a smoke alarm device, which light is producible in quantity and has a performance which is highly predictable. The present light readily compensates for different microphone sensitivities and is relatively insensitive to component tolerances. The present light has an extremely low battery drain so that with a suitable small battery, continuous operation for a period of almost two years may be expected. Accordingly, this highly simplifies the light, eliminating the need for both light activated circuitry and strobe circuitry. The present light is highly insensitive to extraneous signals and actually uses to its advantage the reduction in battery voltage when the light turns on to prevent the circuit from going into an oscillation mode.

Briefly, the present light activated by the sound signal of a smoke alarm comprises a microphone, a light bulb, a source of power, an amplifier circuit responsive to the microphone, the amplifier circuit including an adjustable negative feedback loop for controlling the gain thereof to compensate for different microphone sensitivities, circuit means including a first capacitor and rectifier means responsive to the output of the amplifier circuit for charging a second capacitor for producing a first voltage signal across the second capacitor, the value of the second capacitor being significantly higher than the value of the first capacitor, and means for draining the charge on the second capacitor whereby many cycles of a suitable high frequency signal must pass before the first voltage signal rises above a reference level, means coupled to the power source for producing a second, reference signal, switch means interconnecting the source of power and a light bulb for selectively activating the light bulb, and a comparator circuit responsive to the first and second voltage signals for activating the switch means when the first voltage signal exceeds the second voltage signal.

OBJECTS, FEATURES AND ADVANTAGES

It is therefore the object of the present invention to solve the problems associated with prior known smoke alarm activated lights. It is a feature of the present invention to solve these problems by providing a circuit responsive to a microphone for turning on a light bulb in the presence of the sound signal of a smoke alarm. An advantage to be derived is a circuit which is producible in quantity. Another advantage is a circuit whose performance is predictable. Still another advantage is an operating battery life which will approach two years. Another advantage is a circuit which is highly insensitive to component tolerances. Another advantage is a circuit which readily compensates for different microphone sensitivities. Another advantage is a circuit which highly discriminates against spurious signals. Another advantage is a circuit which does not go into an oscillation mode when triggered by the sound signal of a smoke alarm. Another advantage is a circuit which, once triggered from a proper sound source, will maintain the light on even if the sound source diminishes significantly.

Still other objects, features, and attendant advantages of the present invention will become apparent to those skilled in the art from a reading of the following detailed description of the preferred embodiment constructed in accordance therewith, taken in conjunction with the accompanying drawings wherein:

BRIEF DESCRIPTION OF THE DRAWINGS

The sole FIGURE is a schematic diagram showing the present circuit for activating a light in response to the sound signal of a smoke alarm.

DESCRIPTION OF THE PREFERRED EMBODIMENT

Referring now to the drawings, there is shown a smoke alarm activated light, generally designated 10, including a light bulb 11 responsive to the sound of a smoke alarm device for providing illumination for evacuation of a building in response to the alarm. Light 10 includes a microphone 12 and a power supply 13, preferably a 9 volt, 500 mAH battery. Light 10 also includes circuitry interconnecting power supply 13, microphone 12 and light bulb 11 for turning light bulb 11 on and off. All of the components of light 10 may be mounted in a suitable housing (not shown), which would be positionable on a bracket (not shown), in spaced relation to a smoke alarm device (not shown). Such housing would evidently be positioned at a location to provide illumination where it would be necessary to permit occupants of a building aroused from sleep by the alarm from the smoke detector to safely evacuate the building.

The negative terminal of battery 13 is connected to a first common line 14 whereas the positive terminal of battery 13 is connected via an on/off switch 15 to a second common line 16. Switch 15 functions as an on/off switch for the entire circuit. One terminal of light bulb 11 is connected to line 16 whereas the other terminal thereof is connected via a switch 17 to line 14. Switch 17 may conveniently be of the type which closes automatically when the housing in which light 10 is mounted is removed from its mounting bracket so that light 10 can be used as a portable light. A rectifier diode 18 may also be connected between lines 14 and 16 to prevent damage to the circuit in the event that battery 13 is reversed during installation.

The majority of smoke detectors produced today use a piezoelectric alarm having a sound signal lying in the range of from 2.7 to 3.2 kHz. Accordingly, in order to provide light 10 with a high level of false alarm immunity, it is necessary that light 10 be frequency selective. This can be achieved in a variety of ways. Scott et al suggests the use of a frequency selective microphone. This is certainly a possibility, if such a microphone is available. Another possibility is to provide light 10 with suitable band pass filters. Still another possibility is to mount microphone 12 in an acoustic cavity which will render microphone 12 responsive only to signals in the 2.7 to 3.2 kHz range. The preferred approach of the present invention will appear more fully hereinafter.

One end of microphone 12 is connected to line 14. The other end is connected via a capacitor 20 to the base of a transistor 21. The base of transistor 21 is also connected via resistors 22 and 23 to lines 14 and 16, respectively. The emitter of transistor 21 is connected via a resistor 24 to line 14 whereas the collector thereof is connected via a resistor 25 to line 16. The collector of transistor 21 is also connected to the base of a transistor 26, the collector of which is connected to the base of a transistor 28 and via a resistor 27 to line 14. The emitter of transistor 26 is connected via the parallel combination of a resistor 30 and a capacitor 31 to line 16.

The emitter of transistor 28 is connected via the parallel combination of a resistor 32 and a capacitor 33 to a junction 34 which is connected via a potentiometer 35 to line 14 and via a feedback capacitor 36 to the emitter of transistor 21. The collector of transistor 28 is connected via a resistor 37 to line 16 and via a capacitor 38 and a diode 39 to the base of a transistor 40. The junction between capacitor 38 and diode 39 is connected via a diode 41 to line 14. The base of transistor 40 is also connected via the parallel combination of a capacitor 42 and a resistor 43 to line 14. The value of capacitor 42 would be significantly higher than the value of capacitor 38. In the preferred embodiment of the invention, the value of capacitor 42 is almost five thousand times the value of capacitor 38.

The emitter of transistor 40 is connected to the emitter of a transistor 45, both of which are connected via a resistor 46 to line 14. The collector of transistor 45 is connected directly to line 16 whereas the collector of transistor 40 is connected via a resistor 47 to line 16. The base of transistor 45 is connected via resistors 48 and 49 to lines 14 and 16, respectively.

The collector of transistor 40 is connected to the base of a transistor 51, the emitter of which is connected to line 16. The collector of transistor 51 is connected via a resistor 52 to line 14 and to the base of a transistor 53. The emitter of transistor 53 is connected to line 14 whereas the collector thereof is connected to the junction between light bulb 11 and switch 17 and via a resistor 54 to the base of transistor 45.

In operation, transistors 21, 26 and 28 form a direct coupled amplifier 29 with an open loop AC gain of typically 8000. Resistors 22-25, 27, 30, 32 and 37 and potentiometer 35 establish the bias points for amplifier 29. Capacitor 36 provides negative feedback and potentiometer 35 permits the level of feedback to be varied to set the operating gain over a range of 10 to 1 as needed for various microphone sensitivities. Capacitor 36 functions as an emitter bypass for transistor 21 and also provides for frequency selectivity in the feedback signal so that the amplifier circuit also operates as a high pass filter. Capacitor 33 serves to bypass resistor 32 for high frequency signals, but greatly reduces the voltage gain of transistor 28 at low frequencies. Capacitor 20 also operates as a high pass filter and, in addition, blocks the DC voltage of power supply 13 from microphone 12. All three of these capacitors decrease the sensitivity of light 10 to spurious noise signals which are typically low in frequency content.

Although amplifier 29 is direct coupled, the DC voltage gain is only about 1.3. This means that variations in bias point will be minimized with full worst case variations in component values and over a reasonable temperature range. This makes amplifier 29 highly insensitive to tolerance problems and temperature variations and insures that light 10 will operate in the same manner regardless of the different microphone sensitivities encountered in use.

The output of amplifier 29 at the collector of transistor 28 is then detected by diodes 39 and 41 to form a voltage responsive to the peak-to-peak value. This voltage is then used to charge capacitor 42. Since the value of capacitor 38 is much less than the value of capacitor 42, many cycles of a signal must pass to cause capacitor 42 to reach a trigger level, to be described shortly. Furthermore, this combination acts as a high pass filter because resistor 43 is constantly draining the charge on capacitor 42. At low frequencies, the pumping action of capacitor 38 in charging capacitor 42 is insufficient to replace the charge drained off of capacitor 42 by resistor 43. Accordingly, only many cycles of a signal above 2 kHz will operate to continuously charge capacitor 42. This prevents extraneous sounds, such as those occurring from the slamming of a door, and low frequency signals from triggering light 10. On the other hand, a signal in the frequency range of a piezoelectric alarm has no problem in charging capacitor 42 to the reference level within a few seconds.

The DC voltage level on capacitor 42 is compared with a reference voltage established by the resistive voltage divider including resistor 49, paralleled with resistor 54, and resistor 48, by the differential pair of transistors 40 and 45 which operate as a comparator circuit 44. When the voltage on capacitor 42 is large enough so that it exceeds the voltage at the base of transistor 45, enough current flows through resistor 47 to turn on transistor 51. Transistors 51 and 53 operate as a switch 55 whereby the turning on of transistor 51 also turns on transistor 53, permitting current to flow through light bulb 11. Resistor 54 provides regenerative switching and hysteresis to prevent light 10 from going into an oscillation mode with light bulb 11 turning on and off.

That is, when transistor 53 turns on, light bulb 11 will draw a load current which typically may be 550 mA, with an instantaneous transient current many times larger. The voltage of power supply 13 will certainly drop, resulting in a significant transient voltage drop between lines 14 and 16. Such a transient voltage drop, in other circuits, often causes the circuit to go into an oscillation mode with the light turning on and off. With the present circuit, the sudden drop in battery voltage also reduces the reference voltage applied to the base of transistor 45. The AC signal gain will change relatively little due to the feedback arrangement shown and, accordingly, the voltage applied to the base of transistor 40 will change only slightly, due primarily to the increased loading caused by base current in transistor 40. Furthermore, this change is slow since capacitor 42 must discharge. This means that the comparator conditions for turn on are in fact improved by the voltage transient to insure reliable operation and to provide a certain hysteresis to maintain turn on, even if the sound level begins to drop.

Resistor 54 provides a second means of intentional hysteresis. With lamp 11 off, resistor 54 is effectively connected between the base of transistor 45 and the common line 16. As lamp 11 is turned on, the collector of transistor 53 drops such that resistor 54 is now effectively tied between the base of transistor 45 and common line 14. This reduces the reference voltage applied to the base of transistor 45 as the circuit is triggered.

Even after the sound is removed, light bulb 11 continues to be powered for a short time (for several seconds if the sound level is well above marginal threshold level) due to the large discharge time constant. Thus, a burst mode in the input sound will maintain light bulb 11 on during the quiet periods.

When the input sound level does drop below the set trigger level, transistors 51 and 53 begin to turn off. This allows the voltage of battery 13 to rise due to the decreased load current. This, as well as the restoration of battery voltage at the collector of transistor 53, also increases the reference voltage at the base of transistor 45 to provide another regenerative and positive action during turn off.

With the present circuit, battery drain should be less than about 25 $\mu$A in the worst case, with a typical value of about 22 $\mu$A. Assuming the use of a 500 mAH battery with 350 mAH available and no self-deterioration, the circuit would typically operate for almost two years.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:

1. A light activated by the sound signal of a smoke alarm comprising;
   a microphone;
   a light bulb;
   a source of power;
   an amplifier circuit responsive to said microphone, said amplifier circuit including an adjustable feedback loop for controlling the gain thereof to compensate for different microphone sensitivities wherein said amplifier circuit comprises a direct coupled, multiple stage amplifier with a feedback capacitor between the first and last stages thereof whereby the feedback increases with increasing frequency;
   circuit means including a first capacitor and rectifier means responsive to the output of said amplifier circuit for charging a second capacitor for producing a first voltage signal across said second capacitor, the value of said second capacitor being significantly higher than the value of said first capacitor, and means for draining the charge on said second capacitor;
   means coupled to said power source for producing a second, reference voltage signal;
   switch means interconnecting said source of power and said light bulb for selectively activating said light bulb; and
   comparator circuit means responsive to said first and second voltage signals for activating said switch means when said first voltage signal exceeds said second voltage signal.

2. A light activated by the sound signal of a smoke alarm comprising:
   a microphone;
   a light bulb;
   a source of power;
   an amplifier circuit responsive to said microphone, said amplifier circuit including an adjustable feedback loop for controlling the gain thereof to compensate for different microphone sensitivities, wherein said amplifier has a frequency sensitive gain characteristic to discriminate against sounds from sources having a frequency different from that of the smoke alarm wherein said amplifier circuit comprises a direct coupled, multiple stage amplifier with a feedback capacitor between the first and last stages thereof whereby the feedback increases with increasing frequency;
   circuit means, including a capacitor, responsive to the output of said amplifier circuit for charging the capacitor for producing a first voltage signal across said capacitor, and means for draining the charge on said capacitor;
   means coupled to said power source for producing a second, reference voltage signal;
   switch means interconnecting said source of power and said light bulb for selectively activating said light bulb; and
   comparator circuit means responsive to said first and second voltage signals for activating said switch and when said first voltage signal exceeds said second voltage signal.

* * * * *